United States Patent [19]

Unger et al.

[11] 4,388,131
[45] Jun. 14, 1983

[54] METHOD OF FABRICATING MAGNETS

[75] Inventors: John C. Unger, San Diego; Sidney J. Schwartz, Vista; Ling G. Chow, San Diego, all of Calif.

[73] Assignee: Burroughs Corporation, Detroit, Mich.

[21] Appl. No.: 218,866

[22] Filed: Dec. 22, 1980

Related U.S. Application Data

[60] Division of Ser. No. 70,238, Aug. 27, 1979, abandoned, which is a continuation of Ser. No. 792,577, May 2, 1977, abandoned.

[51] Int. Cl.³ .................. B32B 31/18; B42C 15/00
[52] U.S. Cl. ............................. 156/89; 264/58; 264/61; 428/900
[58] Field of Search .............. 365/2; 156/89; 428/539, 428/900; 148/101, 121, 122; 264/58, 60, 61

[56] References Cited

U.S. PATENT DOCUMENTS

| | | | |
|---|---|---|---|
| 2,985,939 | 5/1961 | Brockman | 156/89 |
| 3,333,333 | 8/1967 | Noack | 156/89 |
| 3,333,334 | 8/1967 | Kuliczkowski et al. | 156/89 |
| 3,462,746 | 8/1969 | Bartlett | 340/173.2 |
| 3,505,139 | 4/1970 | Wentworth | 156/89 |
| 3,602,986 | 9/1971 | Conwicke | 29/608 |
| 3,611,196 | 10/1971 | Tolksdorf | 264/61 UX |
| 3,629,519 | 12/1971 | Hanak | 179/100.2 C |
| 4,109,377 | 8/1978 | Blazick et al. | 264/61 X |

FOREIGN PATENT DOCUMENTS 514604  1/1938  United Kingdom ................ 335/303

OTHER PUBLICATIONS

IEEE Transactions on Magnetics–vol. Mag.–12, No. 6, Nov. 1976, pp. 645–647.

*Primary Examiner*—Caleb Weston
*Attorney, Agent, or Firm*—John J. McCormack; Nathan Cass; Kevin R. Peterson

[57] ABSTRACT

This disclosure relates to a bias field magnet for magnetic bubble memory devices which is formed of alternating layers of hard and soft ferrite powders which are subsequently fired together to form a magnetic structure. A particular embodiment of the present invention resides in a structure where the hard ferrite layer is encased on both its top and bottom surfaces by soft ferrite layers.

7 Claims, 10 Drawing Figures

METHOD OF FABRICATING MAGNETS

This is a division, of application Ser. No. 070,238, filed Aug. 27, 1979 abandoned, which is, in turn, a (Streamlined) continuation of U.S. Ser. No. 792,577, filed May 2, 1977, now abandoned.

BACKGROUND OF THE INVENTION

1. Field of Invention

This invention relates to a method of fabricating bias field magnets for magnetic bubble memory devices as well as to the magnets produced thereby. More specifically, the present invention is directed toward such a method to produce bias field magnets having a more uniform magnetic field as well as being of a simplier construction.

2. Description of the Prior Art

A particular bias field magnet for magnetic bubble devices as well as the mechanism and structure of such devices themselves is provided in Bobeck, Boneyhard and Ge, *Magnetic Bubbles—An Emerging New Memory Technology*, Proceedings of IEEE, Volume 63, Number 8, Aug. 1975, Pages 1176–1195. The bias field described therein is provided by a modified Watson-type magnet consisting of a pair of soft ferrite plates and Index magnet inserts. In this structure, the soft ferrite sheets improve the bias field uniformity of the hard ferrite magnets. However, the bias field uniformity can still be improved by insuring that there are no air gaps between the hard and soft ferrite magnets. Furthermore, it is proposed that a structure can be provided which can be fabricated as a one piece assembly thereby reducing the cost of manufacture. Another example of the modified Watson-type magnet is disclosed in the Chow, et al. U.S. Pat. No. 5,927,397.

Magnetic bubble memory devices employ the mechanism of cylindrical magnetic domains formed within a thin magnetic layer which may be a magnetic garnet grown epitaxially on a non-magnetic garnet substrate. The magnetic domains are moved within the layer along propagation paths formed therein under the influence of external magnetic fields. Movement of the magnetic domains or bubbles is caused by creating a rotating magnetic field within the plane of the magnetic layer. In addition, a bias field is applied normal to that plane to provide a stable condition for magnetic domains at approximately their mid range diameter between strip out and collapse.

The bias field requirement can vary from garnet wafer to garnet wafer over a wide range and, therefore, it is required that the bias field be as uniform as possible to allow greater margin in the circuit and wafer designs and the processes for creating the wafers. It is preferable to have a bias field uniform within half a percent of its nominal value normal to the plane of the garnet wafer in the volume of the epitaxial bubble film. The above described Bobeck, et al article and the Chow et al Patent describe structures are designed to achieve more uniform fields. However, the bias field magnets of those disclosures are formed of separate hard and soft magnetic bodies which later must be bonded together. This results in air gaps between the respective magnetic layers which tend to disturb the magnetic field uniformity. In addition, in fabrication, the surfaces must be ground in order to obtain a high degree of flatness and this contributes to the costs of the fabrication.

It is, then, an object of the present invention to provide an improved bias field magnet for magnetic bubble memory devices which magnet has a highly uniform magnetic field.

It is another object of the present invention to provide a bias field magnet having a highly uniform field, the uniformity which is not disturbed by air gaps in the structures of the magnet.

It is still a further object of the present invention to provide a bias field magnet which has a highly uniform field and which also is simple to fabricate.

SUMMARY OF THE INVENTION

In order to provide return flux paths for the bias field in a magnetic bubble memory device, the device is enclosed in a permalloy cover and the bias field magnets of the present invention are affixed to the inside surfaces of the upper and lower sections of that cover. In one embodiment of the present invention the permalloy cover is not required as the return flux paths are provided a magnetically permeable yoke which couples the upper and lower magnetic structures. Another embodiment does not utilize a flux closure path. To provide a bias magnet having a highly uniform field, the magnet structure is formed of composite layers of hard and soft ferrites which layers are formed of ferrite powders that are then fired together to provide more intimate contact between the layers and to minimize air gaps.

A feature, then, of the present invention resides in a bias field magnet for magnetic bubble memory devices which is formed of alternating layers of hard and soft ferrite powders which are subsequently fired together to form a magnetic structure. A particular embodiment of the present invention resides in a structure where the hard ferrite layer is encased on both its top and bottom surfaces by soft ferrite layers.

DESCRIPTION OF THE DRAWINGS

The above and other objects, advantages and features of the present invention will become more readily apparent from a review of the following specification when taken in conjunction with the drawings wherein.

GENERAL DESCRIPTION OF THE INVENTION

Figure 1:
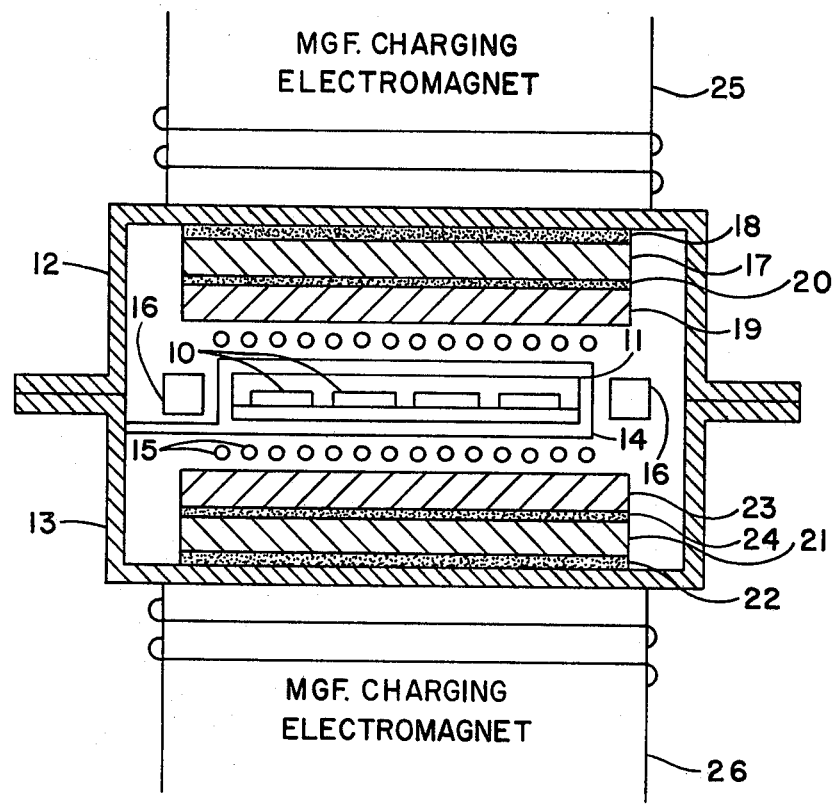
FIG. 1 is a cross-sectional area of a magnetic bubble memory device of the prior art.

A cross-sectional view of prior art magnetic bubble memory device packages is illustrated in FIG. 1. As shown therein, the bubble memory devices in the form of garnet chips 10 are mounted within assembly 11 that is inserted in the package formed of upper cover 12 and lower cover 13 which are of a permalloy or other high magnetic permeability material. To provide the appropriate rotating magnetic fields in the plane of the garnet chips, X-drive coil 14 and Y-drive coil are formed to receive assembly 11. X-drive coil 14 and Y-drive coil 15 are oriented at right angles to one another so that when properly excited the appropriate rotating magnetic field will be created in the plane of the chips. Z-drive coil 16 is also provided to create a magnetic field perpendicular to the plane of the garnet chips to allow varying the bias and the collapsing of unwanted bubbles during the test procedures as will be more thoroughly described below.

Permanent magnet 17 is mounted inside of upper cover 12 by adhesive layer 18. Soft magnetic layer 19 is secured to permanent magnet 17 by adhesive layer 20. Similarly, permanent magnet 21 is attached to lower cover 13 by adhesive layer 22 and soft magnetic layer 23 is attached to permanent magnet 22 by adhesive layer 24. The purpose of the soft magnetic layers which are of a high permeability is to provide for more uniform distribution of the magnetic field of permanent magnets 17 and 21 as was described above. Upper and lower covers 12 and 13 are of a high permeable material such as permalloy so as to provide the return flux paths for respective permanent magnets 17 and 21 and also to shield out outside magnetic sources.

After fabrication of the package, electro magnets 25 and 26 are placed in contact with the upper and lower covers 12 and 13 to charge the internal permanent magnets 17 and 21 to a nominal value which may be, for example, 100 oersteds for a memory device adapted to sustain bubble domains 6 microns in diameter. During testing of the assembly, it may become evident that the collective circuits would function better with a lower nominal value, e.g. 95 oersteds, or it may be evident, after assembling, that the magnetic field has changed due to the shunting effect of the covers 12 and 13 and an increased nominal value is required. During the test procedure, a current is applied to Z-coil 16 which changes the internal bias field while the magnetic bubble chips 10 are being tested. In this manner, the particular amount of change required by the permanent magnetic field may be obtained. During the testing of the magnetic devices, an increase in the bias field may approach a point where the individual bubbles collapse. On the other hand, a decrease in the bias field would result in another failure mode where some of the bubble domains present may become stripe domains or new undesired bubbles may start appearing due to spurious nucleation. Thus, during the test sequence, there is a proper bias field at which is obtained the maximum tolerance to variations in the other circuit parameters of the bubble devices. Ideally, the permanent magnets should be tuned to mid-point between the two extremes. The bias field created at the bubble chip locations by the permanent magnets is adjusted by adjusting the degree to which the permanent magnets are saturated.

In the prior art embodiment as illustrated in FIG. 1, the permanent magnets 17 and 21 are typically prepared as flat pieces and must be machined or ground in order to obtain reasonable flatness. Similarly, the soft magnetic layers 19 and 23 must also be reasonably flat so that air gaps formed by the respective adhesive layers 20 and 24 are minimized if not rendered negligible. If such air gaps are excessive due to the curvature of the respective magnetic layers, the permanent magnetic material should be thickened or charged more towards saturation in order to compensate therefor and the soft magnetic layer would also have to be thicker in order to provide for additional redistribution of the magnetic field. The necessity for the soft magnetic layers arises from the non-uniform distribution of the magnetic domain structures in the permanent magnets. If the permanent magnet layers could be charged uniformly, there would be no necessity for the soft magnetic layers. The ability to charge layers 17 and 21 is enhanced by the bias structures described in relation to all embodiments of the invention since they optimize the magnet charging process and in so doing reduce the thicknesses required for the soft magnetic layers 19 and 23.

Figure 2:
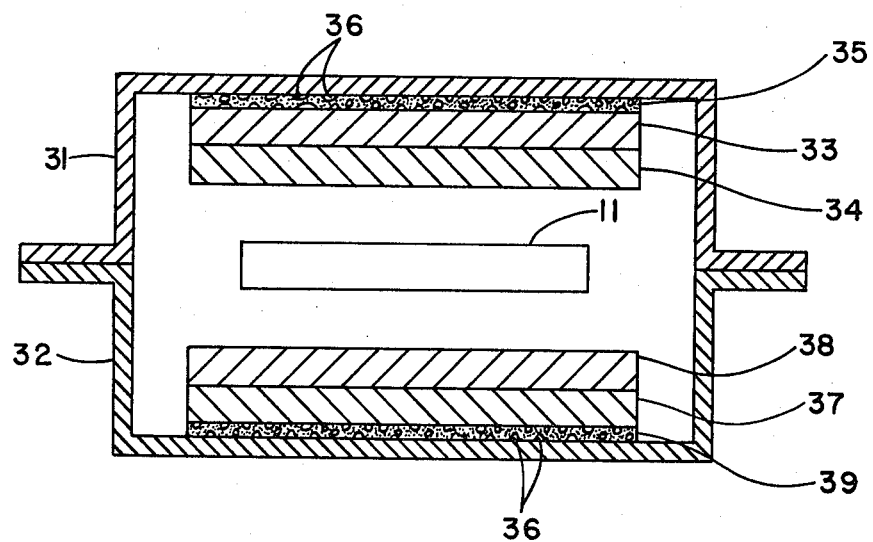
FIGS. 2–6 are cross-sectional areas of different embodiments of the present invention.

One embodiment of the present invention is illustrated in FIG. 2. As shown therein, layer 33 is formed of a hard ferrite powder and soft magnetic layer 34 is formed of a soft ferrite powder which layers are fired together during fabrication leading to a negligible air gap therebetween as there is diffusion during the firing process across the interface between the two layers. This interface will be a mixture of soft and hard ferrite and will be of sufficiently thin dimension as not to noticably disturb the magnetic field uniformity. This composite structure is then attached to the inside of permalloy upper cover 31 by a layer of adhesive 35 in which are mixed magnetic permeable particles 36. The purpose of particles 36 is to increase the magnetic coupling of the magnet to the permalloy cover 31 and indirectly with the charging electromagnets such as was discussed in regard to the prior art embodiment of FIG. 1.

Similarly, hard magnetic layer 37 and soft magnetic layer 38 are formed of hard and soft ferrite powders respectively which are fired together with the composite structure being attached to the inside lower permalloy cover 32 in the same manner as was the composite structure coupled to upper cover 31.

The fabrication of the structure of FIG. 2 has eliminated one bonding step in the fabrication operation and also eliminates the necessity for machining and grinding the surfaces involved as is required in the prior art embodiments.

Figure 3:
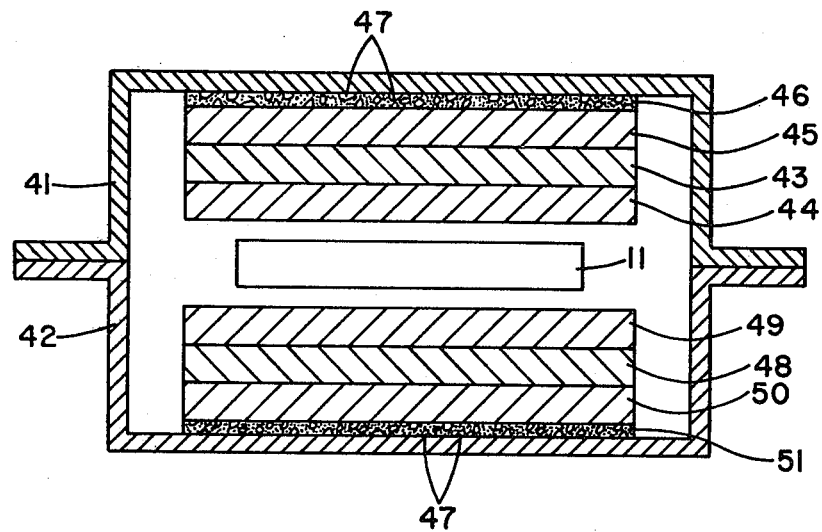

Another embodiment in the present invention is illustrated in FIG. 3. In this embodiment, the bias field magnets are formed of a three layer composite structure. In FIG. 3, the upper bias field magnet is formed of hard ferrite layer 43 and soft ferrite layers 44 and 45 respectively covering the lower and upper surfaces of hard ferrite layer 43. Each layer is formed of an appropriate ferrite powder with the composite structure being fired together so as to eliminate air gaps as was discussed in regard to the composite structure of FIG. 2. This tri-layered structure is then attached to the lower side of upper cover 41 by an adhesive layer 46 in which are mixed soft ferrite particles 47. Again, cover 41 is formed of a magnetic permeable material such as permalloy. The lower bias field magnet is formed of hard ferrite layer 48 and soft ferrite layers 49 and 50 which layers are fired together to form a composite structure that is then attached to lower permalloy cover 42 by way of adhesive layer 50 in which are mixed soft ferrite particles 47.

In the embodiment of FIG. 3, the provision of the hard magnetic layer between the soft magnetic layers provides better coupling to the charging electromagnets so as to provide a more uniform charging field.

Figure 4:
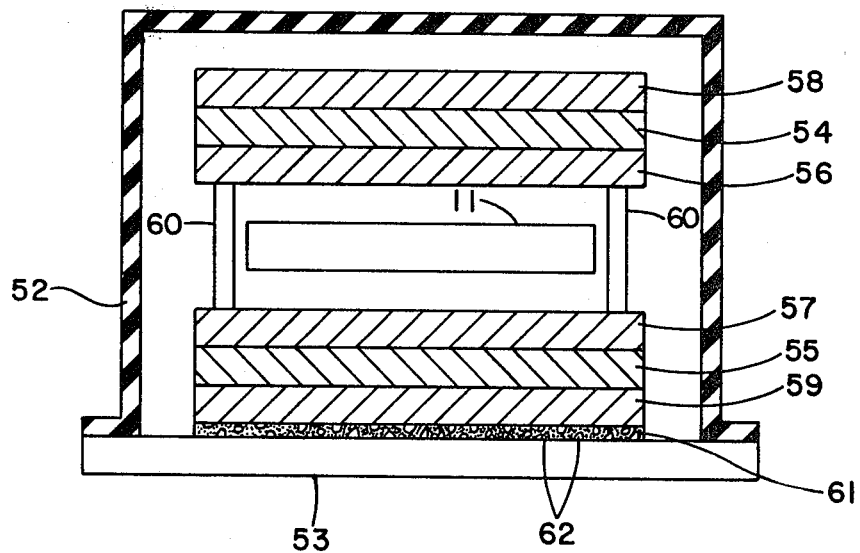

Another embodiment of the present invention is illustrated in FIG. 4. This embodiment again employs the tri-layered composite magnetic structures which were described in relation to FIG. 3. However, if the magnet assembly sufficiently extends beyond the magnetic bubble device assembly 11 and the separation between the respective bias field magnets is kept small, there will be sufficient shielding against outside magnetic influences such that the permalloy covers need not be employed. In FIG. 4, the soft-hard-soft structures formed of ferrite layers 54, 56 and 58 and and also of layers 55, 57, 59 are fabricated in the same manner as was described for the embodiment of FIG. 3. However, now the upper bias field magnet structure is supported on the lower bias field magnet structure by non-magnetic spacers 60. Now, outer cover 52 maybe of a plastic or other non-magnetic material as may be the substrate 53. To insure effective shielding, the outer soft ferrite layers 58 and 59 should be of a greater thickness than required in the embodiments of FIGS. 2 and 3.

Figure 5:
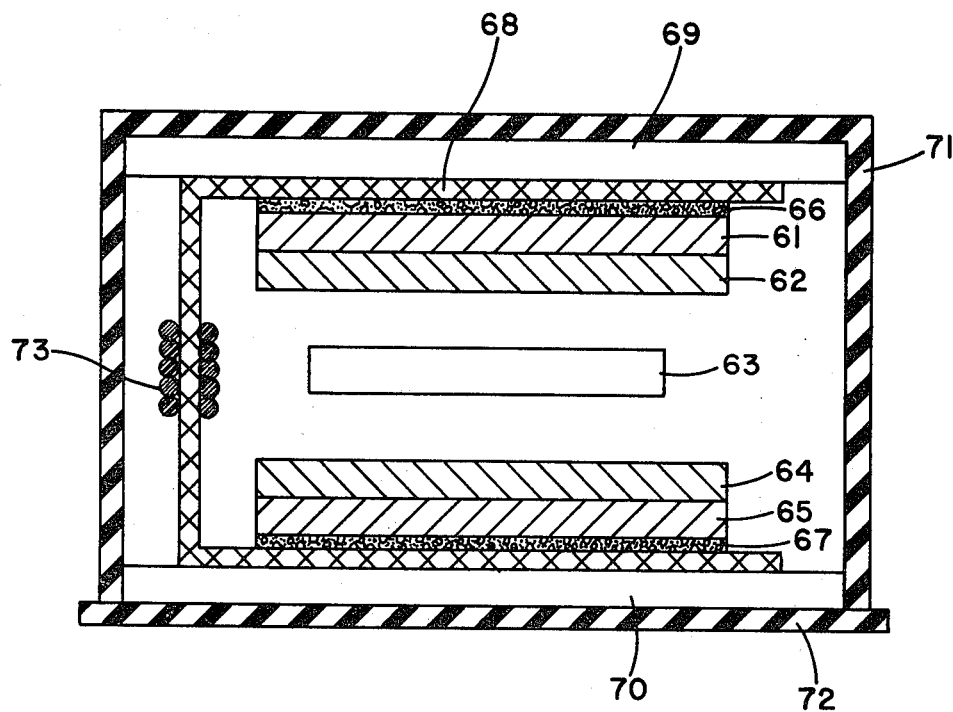
Figure 6:
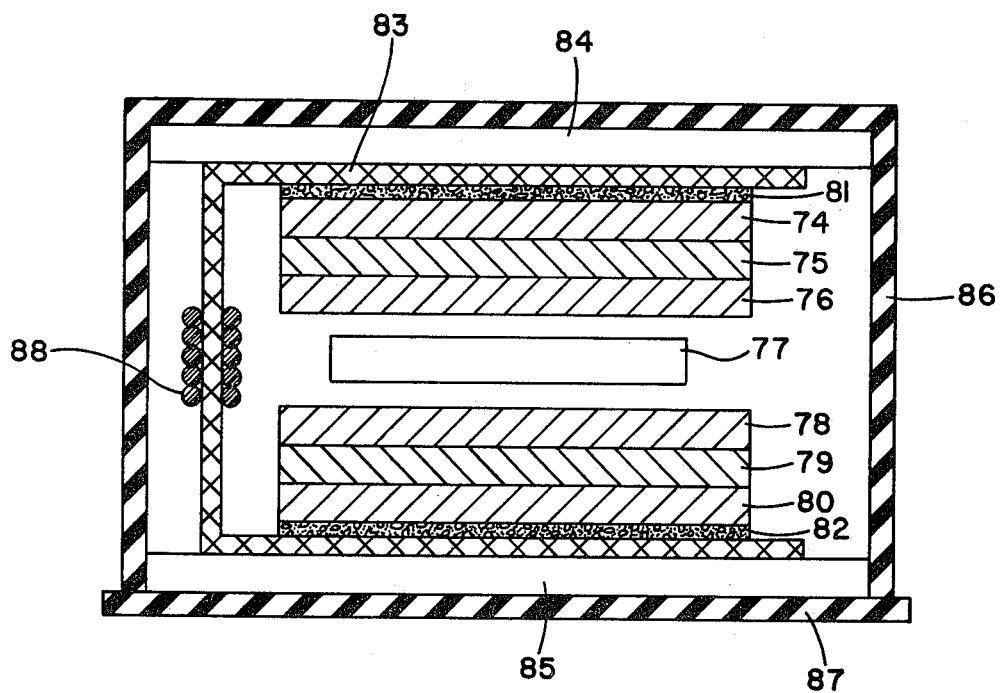

Other embodiments are shown in FIGS. 5 and 6 where the magnetic path is closed by a magnetically permeable yoke. The inner assembly is separated from the cover by non-magnetic materials selected for suitable thermal conduction properties.

The embodiment of FIG. 5 may employ a magnetic or non-magnetic cover 71. The bias field magnet structure is similar to FIG. 1 except that the return flux path is provided by a permeable yoke structure 68 which is contiguous with both the top and bottom portions of cover 71 except that two thermal layers 69 and 70 are provided therebetween which layers are chosen for their particular thermal conductivity. These layers may be metallic or non-metallic depending upon the conductivity required to maintain the bias magnet structures at approximately the same temperature as magnetic bubble device 63. Field excitation coil 73 is to enhance the bias field during testing. In FIG. 5, hard ferrite layers 61 and 65 are each provided with a soft ferrite layer 62 and 64 respectively. The composite structure being attached to permeable layer 68 by adhesive layers 66 and 67.

In FIG. 6 a similar embodiment is shown except that the bias magnetic structures are composite structures of soft-hard-soft ferrite layers which are respectfully attached to permeable yoke 83 by adhesive layers 81 and 82. In FIG. 6, hard ferrite layers 75 and 79 are formed into a composite structure with soft ferrite layers 74, 76, 78 and 80 respectfully. Again, the field excitation coil 88 is provided to enhance the bias magnetic field. As in the case of FIG. 5, thermal conductive layers 84 and 85 are provided which are chosen out of the appropriate material to have thermal conductivities of the magnitude required to maintain bias magnetic structures at the same temperatures as magnetic bubble device 77.

DESCRIPTION OF THE METHOD

A preferred composition for the hard ferrites employed in the present invention is barium ferrite, $BaFe_{12}O_{19}$, and the preferred soft ferrite is manganese zinc ferrite.

Figure 7:
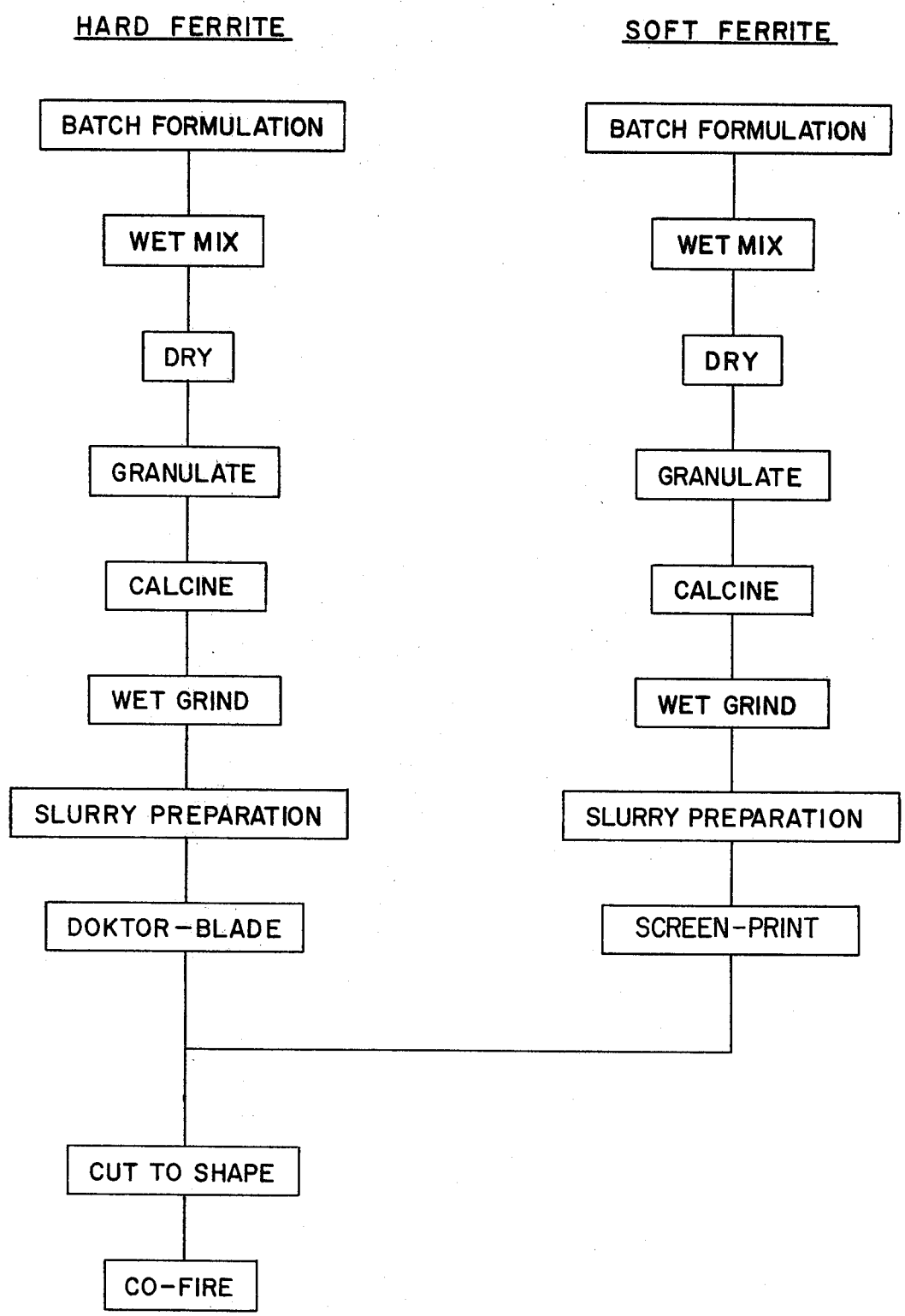
FIGS. 7–10 are flow charts of different embodiments of the method employed in the present invention.

One embodiment in the process of the present invention is illustrated in FIG. 7 which is a flow chart of the steps involved in that embodiment. As indicated therein, the hard ferrite is batch formulated from ferrite oxide, $Fe_2O_3$, and barium carbonate, $BaCO_3$, with a ratio of ferrite oxide to barium carbonate of approximately 411 to 91 by weight. This formulation is then wet mixed with water with the mixture being dried and then granulated. The granules are then calcined by heating to a temperature of 2400°-2600° F. and then are wet ground as is well-known in the art. A slurry is then prepared of the ground barium ferrite with a polyvinyl butyrate system as the plasticizer with the ratio of 90% barium ferrite to 10% of the polyvinyl butyrate system. The polyvinyl butyrate system is preferably 25% dibutyl phthalate and 75% polyvinyl butyrate. This system is in solution with a solvent comprising 60% toluene, 30% methyl isobutyl ketone and 10% ethyl alcohol. The slurry is then cast into a tape with use of a "Gardner Knife" so as to "Doktor-blade" or form a thick film approximately 0.125" thick.

As further illustrated in FIG. 7, the soft ferrite is similarly prepared by the batch formulation of manganese carbonate, $MnCO_3$; zinc oxide, ZnO; and ferrite oxide, $Fe_2O_3$. Again the formulature is mixed, dried, granulated, calcined and ultra fine wet ground. A slurry is prepared, however this time only with water, with the mixture then being screened printed on top of the hard ferrite layer described above.

The two layers are then cut to the appropriate shape and cofired to form one embodiment in the composite structure of the present invention.

Figure 8:
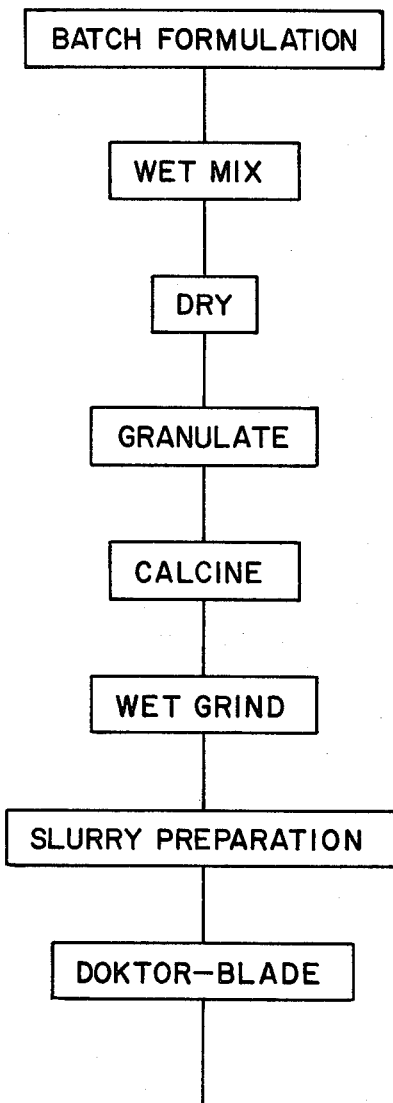
Figure 8:
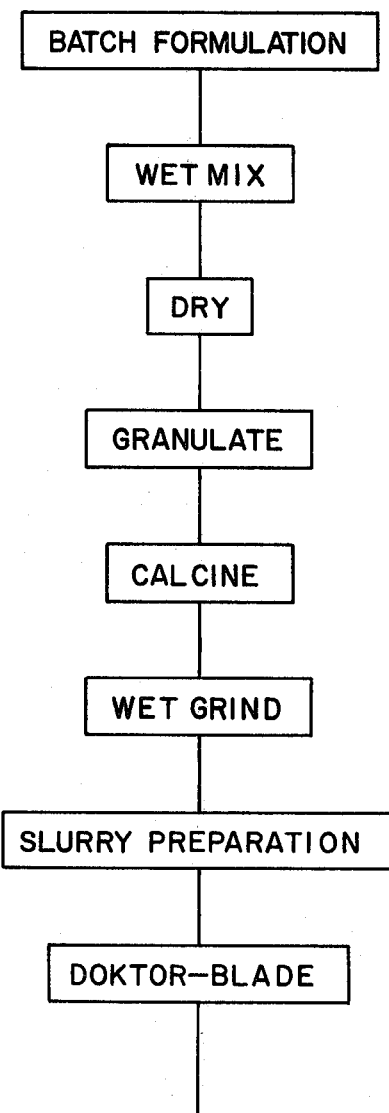

FIG. 8 illustrates another embodiment of the method of the present invention. The various steps in this embodiment are similar to the embodiment of FIG. 7 except that the soft ferrite slurry preparation is now similar to the hard ferrite slurry preparation. The two separate layers being formed by the "Doktor-blade" process which layers are then laminated, cut to shape and cofired.

Figure 9:
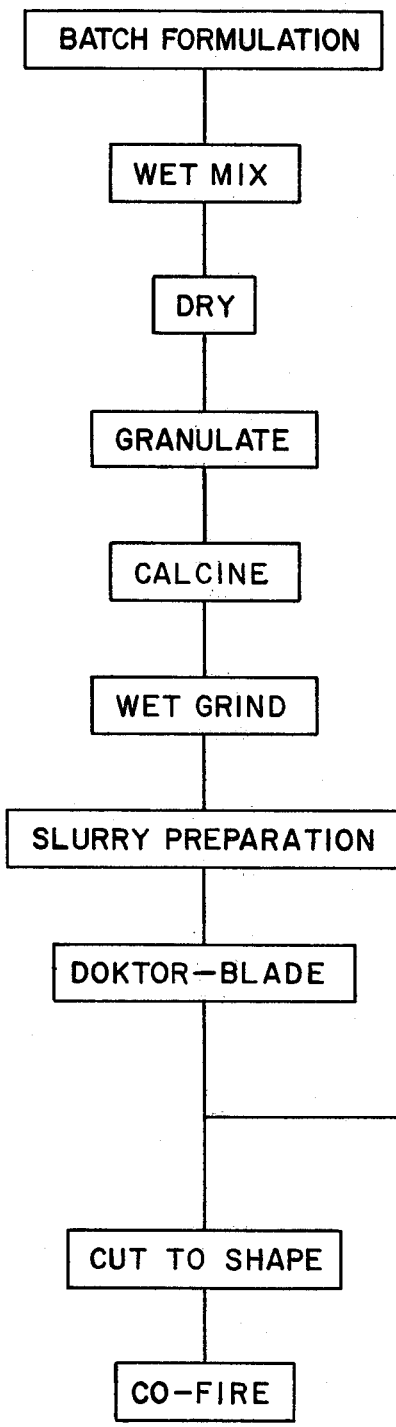
Figure 9:
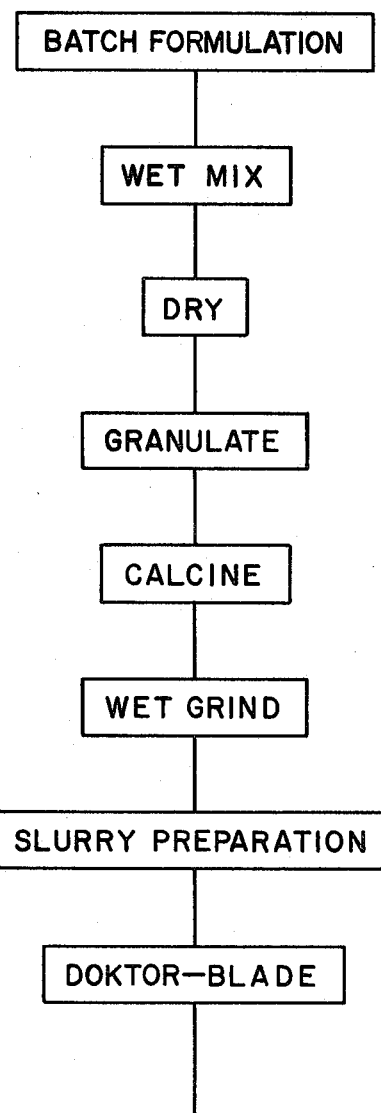

Another embodiment of the method of the present invention is illustrated in FIG. 9 which is similar to the embodiment of FIG. 8 except that the soft ferrite layer is formed from a slurry preparation on top of the hard ferrite layer by the "Doktor-blade" process and the composite structure then cut to shape and cofired.

Figure 10:
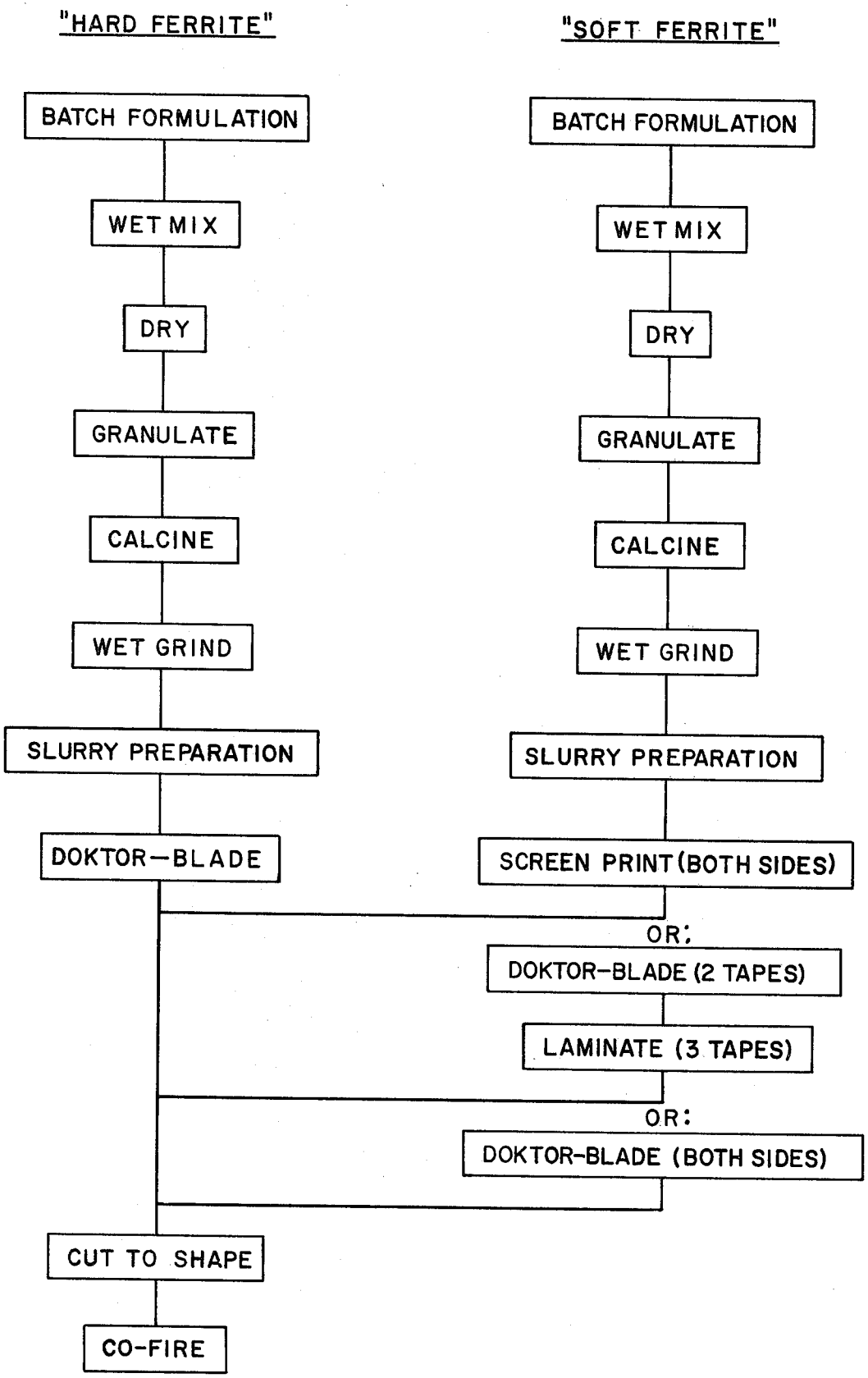

The method of FIG. 10 is designed to form the three layer soft-hard-soft ferrite composite structure and employs the steps of the other embodiment illustrated in different combinations.

In each of the "Doktor-blade" steps described above, it is preferable that the step be performed with the slurry in the presence of a magnetic field normal to the layer being formed so as to enhance the orientation of the magnetic axis of the ferrite particles.

EPILOGUE

The bias field magnetic structure as thus described provides for more uniform fields by eliminating or at least reducing the possibility of air gaps in the magnetic structure. Furthermore, by fabricating the structure out of hard and soft ferrite powders which are fired together, a simpler method of fabrication is achieved since the separate magnetic layers do not have to be ground to achieve the flatness as in the case of prior art.

While specific embodiments of the invention have been described, it will be understood by those skilled in the art that variations and modifications may be made therein without departing from the spirit and scope of the invention as claimed.

What is claimed is:

1. An improved method of fabricating a multi-layer magnet structure comprising the steps:
   forming a first slurry of a first ferrite including certain first oxide additives and casting a first tape therefrom;
   forming at least one other slurry of at least one other chemically different ferrite including certain second oxide additives, at least some which are chemically different from said first oxide additives, and casting an associated tape from each such other slurry;
   cutting strips of prescribed common length and width from each said tape and forming a laminate with the tapes laid-up in prescribed order superposed and pressed together intimately; and
   heating, and cofiring this laminate to cure the tapes and leave them adhered to one another; the slurry consistancy, pressure and heating values being selected to assure that there is sufficient inter-diffusion between the tapes that they may be so co-fired to form an integral magnet with no magnetically-significant air gap between the tapes.

2. The combination as recited in claim 1 wherein each slurry is calcined and said tapes are pressed together to facilitate said cofiring and adhesion.

3. The combination as recited in claim 2 wherein the first ferrite comprises a "magnetically-hard" ferrite; said "other ferrite" comprises a different magnetic material compatible with said ferrite.

4. The combination as recited in claim 3 wherein said "other" ferrite comprises a "magnetically-soft" ferrite.

5. The combination as recited in claim 4 wherein said other ferrite comprises a Manganese-Zinc ferrite.

6. The combination as recited in claim 5 wherein the first ferrite is a Barium ferrite.

7. The combination as recited in claim 6 wherein said calcining is carried out at from 2400° to 2600° F.

* * * * *